(12) United States Patent
Kasai

(10) Patent No.: US 9,260,292 B2
(45) Date of Patent: Feb. 16, 2016

(54) SENSOR DEVICE

(71) Applicant: OMRON Corporation, Kyoto-Shi, Kyoto (JP)

(72) Inventor: Takashi Kasai, Shiga (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/376,945

(22) PCT Filed: Feb. 26, 2013

(86) PCT No.: PCT/JP2013/054947
§ 371 (c)(1),
(2) Date: Aug. 6, 2014

(87) PCT Pub. No.: WO2013/129386
PCT Pub. Date: Sep. 6, 2013

(65) Prior Publication Data
US 2014/0374859 A1 Dec. 25, 2014

(30) Foreign Application Priority Data
Feb. 29, 2012 (JP) .................................. 2012-043380

(51) Int. Cl.
*B81B 7/00* (2006.01)
*B81C 1/00* (2006.01)
*H04R 19/00* (2006.01)
*H04R 31/00* (2006.01)
*H04R 19/04* (2006.01)
*H04R 1/04* (2006.01)
*H04R 1/06* (2006.01)

(52) U.S. Cl.
CPC .............. *B81B 7/0058* (2013.01); *B81B 7/0064* (2013.01); *B81C 1/00246* (2013.01); *H04R 19/005* (2013.01); *H04R 31/006* (2013.01); *B81B 2201/0257* (2013.01); *B81B 2201/0292* (2013.01); *B81B 2207/115* (2013.01); *H04R 1/04* (2013.01); *H04R 1/06* (2013.01); *H04R 19/04* (2013.01)

(58) Field of Classification Search
CPC ................ B81B 7/0058; B81B 7/0064; B81B 2201/0257; B81B 2207/115
See application file for complete search history.

(56) References Cited

U.S. PATENT DOCUMENTS

| 7,863,714 B2 | 1/2011 | Diamond et al. | |
| 9,013,011 B1 * | 4/2015 | Kuo ........................ | H01L 27/04 257/415 |

(Continued)

FOREIGN PATENT DOCUMENTS

| JP | 2006-74102 A | 3/2006 |
| JP | 2010-56745 A | 3/2010 |

OTHER PUBLICATIONS

International Search Report for Corresponding International Application No. PCT/JP2013/054947, mailed Apr. 16, 2013 (2 pages).

*Primary Examiner* — Allen Parker
*Assistant Examiner* — Wasiul Haider
(74) *Attorney, Agent, or Firm* — Osha Liang LLP

(57) ABSTRACT

A sensor device has a substrate, a sensor section provided on an upper surface of the substrate, a circuit section provided on the upper surface of the substrate, a plurality of connection pads that electrically conduct with the sensor section or the circuit section, and a metal protective film covering at least a part of the circuit section from above.

10 Claims, 6 Drawing Sheets

(56) References Cited

U.S. PATENT DOCUMENTS

| | | | |
|---|---|---|---|
| 2006/0169049 A1* | 8/2006 | Matsubara | B81B 7/0006 73/754 |
| 2007/0057602 A1* | 3/2007 | Song | H04R 31/006 310/328 |
| 2011/0280419 A1* | 11/2011 | Kasai | 381/176 |
| 2012/0030941 A1* | 2/2012 | Kawai | 29/832 |
| 2012/0189144 A1* | 7/2012 | Delaus | B81C 1/0023 381/174 |
| 2012/0319256 A1* | 12/2012 | Lo et al. | 257/666 |

* cited by examiner

SENSOR DEVICE

BACKGROUND

1. Technical Field

The present invention relates to a sensor device and, more particularly, to a sensor device in which a sensor section and a circuit section are formed on the same substrate.

2. Related Art

Of sensor devices having a monolithic structure in which a sensor section and a circuit section are formed on the same substrate, a sensor device configured to prevent the circuit section from being contaminated is disclosed in Patent Document 1.

In a sensor device (MEMS microphone) disclosed in Patent Document 1, a sensor section ("MEMS device 200" in Patent Document 1) is provided in a center of an upper surface of the substrate, and a circuit section ("driving/sensing circuitry 300" in Patent Document 1) is provided around the sensor section. At a boundary between the sensor section and circuit section, a barrier structure ("barrier 500" in Patent Document 1) is provided so as to fully surround the sensor section. Thus, providing the barrier structure between the sensor section and circuit section prevents contamination (ion, etc.) from being transferred from the sensor section to circuit section and further prevents moisture or foreign substances that have entered the sensor section from an external environment from entering the circuit section.

In the sensor device disclosed in Patent Document 1, the barrier structure is provided at the boundary between the circuit section and sensor section, so that protective effect can be seen against interference between the circuit section and sensor section in a direction parallel to a substrate surface, particularly, against movement of contamination, such as ion or foreign substances, between the circuit section and sensor section.

However, such a barrier structure does not have effect of protecting the circuit section from disturbance coming from a direction perpendicular to the upper surface of the substrate. Further, the barrier structure does not have the protective effect also against disturbance entering the circuit section from a side of surface side of the substrate. When disturbance such as an electromagnetic wave, light, moisture, or impurities (ion) enters the circuit section from the direction perpendicular to the substrate or the side of surface side of the substrate, adverse effect such as characteristic degradation, malfunction, or failure may occur in the circuit section.

In the case of a general electronic circuit (semiconductor integrated circuit), there is adopted a method that resin-seals the entire circuit section with a molded package so as to protect the circuit section from disturbance from an external environment. However, in a case where the sensor section such as a microphone is provided on the same substrate as the circuit section, a package having a hollow structure is required so as to detect acoustic vibration. In addition, in order to introduce the acoustic vibration into the package, an opening needs to be formed in the package. Thus, in a sensor device having the monolithic structure in which the circuit section and sensor section such as the microphone are formed on the same substrate, it is difficult to cover the entire sensor device with resin for sealing. Further, in the monolithic structure, covering only the circuit section with resin may involve a risk that the resin adheres to the sensor section to obstruct operation of the sensor section and, thus, application of the above-described method to the monolithic structure is difficult. Such a situation is the same with a sensor device in which a sensor section other than the microphone is mounted.

Patent Document 1: U.S. Pat. No. 7,863,714 (FIG. 1)

SUMMARY

One or more embodiments of the present invention protects the circuit section from contamination or disturbance more reliably in a sensor device having a monolithic structure in which the sensor section and circuit section are integrally formed.

A sensor device according to one or more embodiments of the present invention includes: a substrate; a sensor section provided on an upper surface of the substrate; a circuit section provided on the upper surface of the substrate; a plurality of connection pads electrically conducted with the sensor section or the circuit section; and a metal protective film covering at least a part of the circuit section from above. The circuit section may be placed on the upper surface of the substrate or may be embedded into the upper surface of the substrate.

In the sensor device according to one or more embodiments of the present invention, at least a part of the circuit section is covered from above with the metal protective film, and environmental resistance of the part of the circuit section that is covered with the metal protective film is enhanced. That is, according to one or more embodiments of the present invention, light shielding property of a circuit covered with the metal protective film becomes high, preventing malfunction of the circuit. Further, when the metal protective film is connected to the ground, electromagnetic waves from outside can be shielded, making electromagnetic immunity (EMI) and electrostatic-discharge resistance (ESD resistance) of the circuit covered with the metal protective film satisfactory. Further, moisture or ion can be shielded by the metal protective film, humidity resistance of the sensor device is improved and, further, environmental resistance thereof against corrosive gas, heavy metal contamination, or the like is also enhanced. Further, covering the sensor device with the metal protective film enhances mechanical strength of the acoustic sensor.

In a sensor device according to one or more embodiments of the present invention, the circuit section is covered with a first insulating layer, and the metal protective film is formed on an upper surface of the first insulating film. According to one or more embodiments, the circuit section can be protected by the first insulating layer, and formation of the metal protective film on the first insulating film facilitates manufacturing of the metal protective film.

Further, in one or more embodiments, the sensor section includes: a movable electrode provided above the substrate; a dome portion formed of an insulating material fixed to the upper surface of the substrate so as to cover the movable electrode with a gap interposed between itself and movable electrode; and a fixed electrode provided in the dome portion at a position facing the movable electrode. According to one or more embodiments of the present invention, the first insulating layer has a thickness equal to that of the dome portion and is formed of the same material as that of the dome portion. Thus, formation of the first insulating film between the circuit section and metal protective film increases a distance between the circuit section and metal protective film, allowing an electrical parasitic component to be reduced. Further, the dome portion of the sensor section and first insulating layer have the same thickness, allowing the insulating protective film and first insulating layer to be formed using the same material and same process.

Further, in one or more embodiments of the present invention, the sensor section includes: a movable electrode provided above the substrate; a dome portion formed of an insulating material fixed to the upper surface of the substrate so as to cover the movable electrode with a gap interposed between itself and movable electrode; and a fixed electrode provided in the dome portion at a position facing the movable electrode. According to one or more embodiments of the present invention, a surface of the circuit section is covered with a second insulating layer having a thickness equal to that of a gap formed between the movable electrode and fixed electrode, and the metal protective film is formed above the second insulating layer. Thus, formation of the second insulating film between the circuit section and metal protective film increases a distance between the circuit section and metal protective film, allowing an electrical parasitic component to be reduced. Further, a thickness of the second insulating layer is equal to that of an air gap between the movable electrode and fixed electrode, allowing the second insulating layer to be manufactured by the same film formation process as that for a sacrifice layer for forming an air gap between the movable electrode and fixed electrode, thereby simplifying a manufacturing process of the sensor device.

Formation of the metal protective film allows the circuit section to be mechanically and physically protected, so that, in one or more embodiments of the present invention, substantially the entire circuit section is covered with the metal protective film. However, in some cases, an electrical parasitic component such as a parasitic capacitance between the circuit section and metal protective film becomes a problem depending on a type of a circuit provided in the circuit section. In such a case, the metal protective film may be partially removed in an area above the circuit section. The removal of the metal protective film in a circuit that is subject to the electrical parasitic component between the circuit section and metal protective film allows reduction of adverse effect brought about by the electrical parasitic component of the circuit.

Further, in the sensor device according to one or more embodiments of the present invention, the metal protective film may be electrically short-circuited to some of the connection pads. Accordingly, connection of the connection pad to the ground allows the metal protective film to be connected to a ground potential. This further allows the metal protective film and connection pad to be manufactured by the same process.

In a sensor device according to one or more embodiments of the present invention, an outer peripheral portion of the upper surface of the substrate may be exposed from the metal protective film. When a wafer on which a plurality of sensor devices are formed is divided into chips by laser dicing, by exposing the outer peripheral portion of the upper surface of the substrate, it is possible to easily conduct the chip dividing while preventing laser light from being shielded by the metal protective film. According to one or more embodiments of the present invention, the exposed area of the outer peripheral edge portion of the upper surface of the substrate is an area having a length of at least 40 µm or more from an outer peripheral edge of the upper surface of the substrate.

Further, according to one or more embodiments of the present invention, at least a surface of the metal protective film is formed of an Au film. Au has superior corrosion resistance and low electrical resistance. Thus, forming at least a surface of the metal protective film using the Au film makes environmental resistance of the sensor device satisfactory and enhances electromagnetic shield effect.

In a sensor device according to one or more embodiments of the present invention, the sensor section may be an electrostatic capacitance type. That is, the sensor section includes: a movable electrode provided above the substrate; a dome portion formed of an insulating material fixed to the upper surface of the substrate so as to cover the movable electrode with a gap interposed between itself and movable electrode; and a fixed electrode provided in the dome portion at a position facing the movable electrode. In one or more embodiments in which the electrostatic capacitance type sensor section is adopted, the circuit section is covered with a first insulating layer having a thickness equal to that of the dome portion, and the metal protective film is formed on an upper surface of the first insulating layer. According to one or more embodiments, formation of the first insulating layer between the circuit section and metal protective film increases a distance between the circuit portion and metal protective film, thereby allowing an electrical parasitic component to be reduced.

Further, in one or more embodiments of the sensor device having the electrostatic capacitance type sensor section, a surface of the circuit section is covered with a second insulating layer having a thickness equal to that of a gap formed between the movable electrode and fixed electrode, and the metal protective film is formed above the second insulating layer. According to one or more embodiments, formation of the second insulating film between the circuit section and metal protective film increases a distance between the circuit section and metal protective film, allowing an electrical parasitic component to be reduced. Further, a thickness of the second insulating layer is equal to that of an air gap between the movable electrode and fixed electrode, allowing the second insulating layer to be manufactured by the same film formation process as that for a sacrifice layer for forming an air gap between the movable electrode and fixed electrode, thereby simplifying a manufacturing process of the sensor device.

The above-described components may be combined, and the present invention enables many variations by combination of the components.

DETAILED DESCRIPTION

Hereinafter, embodiments of the present invention will be described with reference to the accompanying drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. Although a sensor device (acoustic sensor device) having a microphone structure as a sensor section will be described in the following embodiments, a sensor device according to one or more embodiments of the present invention may have a sensor section other than the microphone structure. Further, the present invention is not limited to the following embodiments and may be modified in design without departing from the scope of the present invention.

First Embodiment

Figure 1:
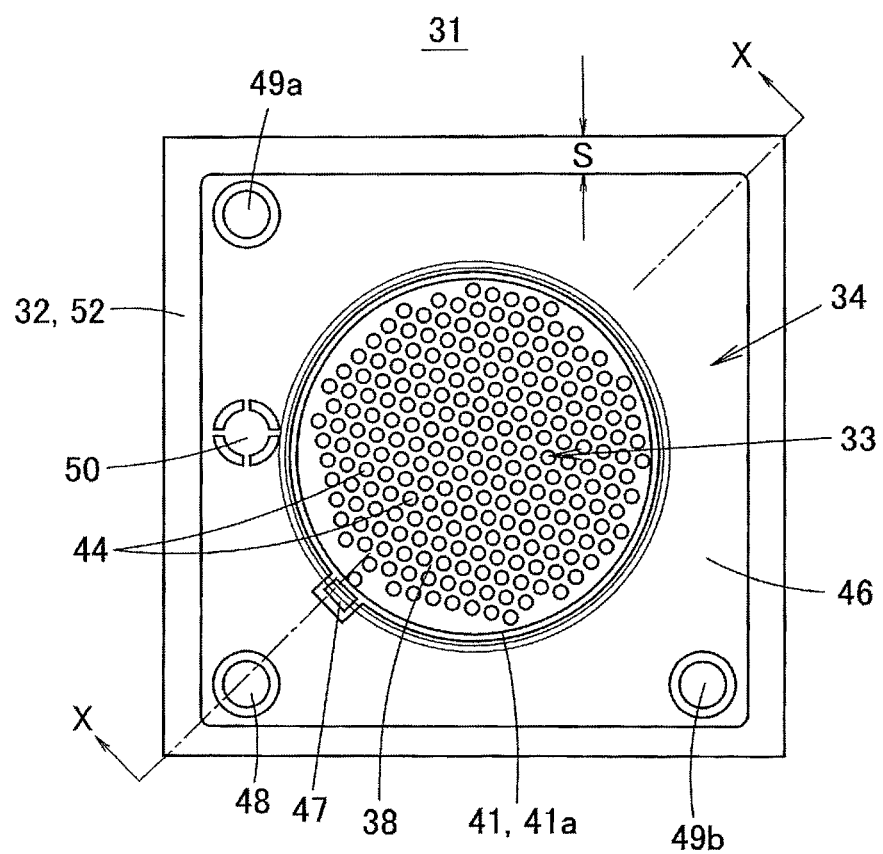
FIG. 1 is a plan view of a sensor device according to a first embodiment of the present invention.
Figure 2:
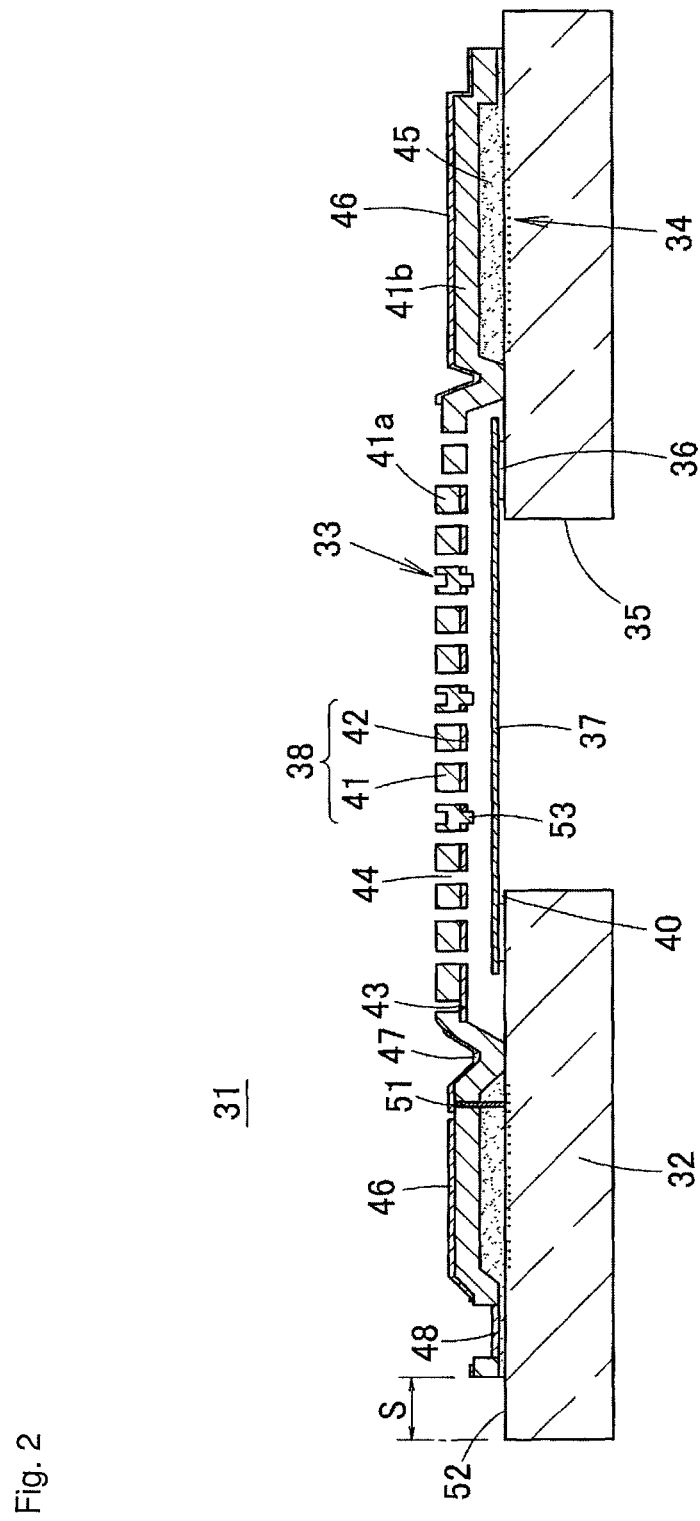
FIG. 2 is a cross-sectional view taken along a line X-X of FIG. 1.
Figure 3:
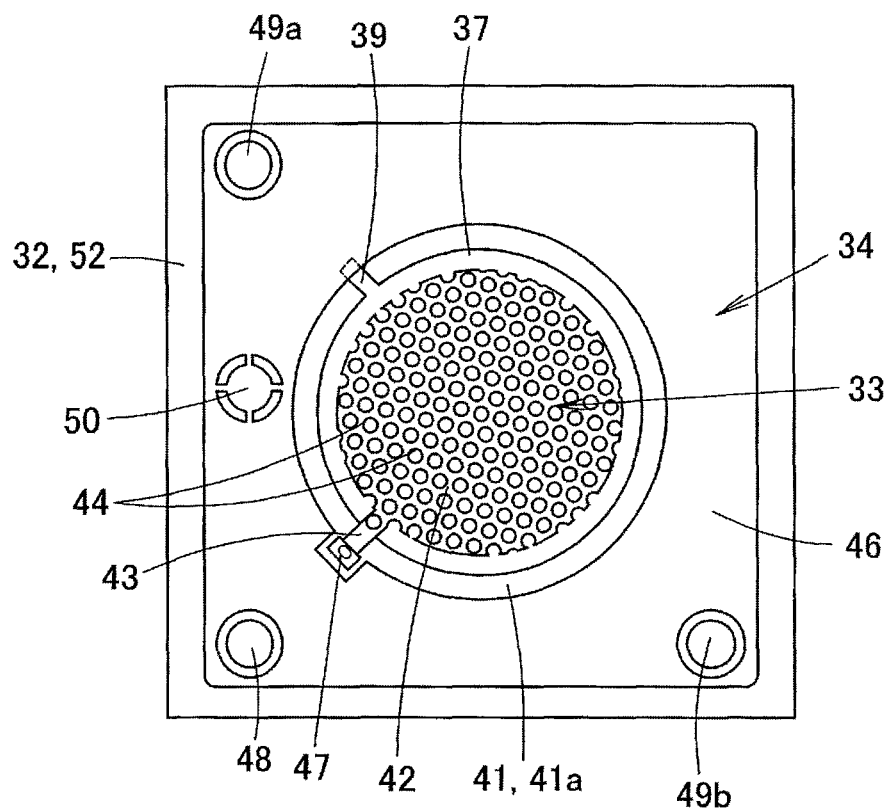
FIG. 3 is a plan view of the sensor device of FIG. 1 in which a protective film is made transparent for descriptive purpose.

A sensor device (microphone) according to a first embodiment of the present invention will be described with reference to FIGS. 1 to 3. FIG. 1 is a plan view of a sensor device 31 according to the first embodiment of the present invention. FIG. 2 is a cross-sectional view taken along a line X-X of FIG. 1. FIG. 3 is a plan view of the sensor device 31 in which a protective film is made transparent.

The sensor device 31 is a microphone having a monolithic structure which is produced by utilizing MEMS technology, in which a sensor section 33 (microphone structure) and a circuit section 34 (integrated circuit) are formed on a single semiconductor substrate 32. The sensor section 33 is provided at a substantially center portion of an upper surface of the semiconductor substrate 32, and the circuit section 34 is provided around the sensor section 33 so as to surround the same. As a matter of course, the sensor section 33 need not always be provided at the center portion of the semiconductor substrate 32, and the circuit section 34 need not always surround the sensor section 33. For example, the sensor section 33 may be provided at a right side area of the upper surface of the semiconductor substrate 32, and the circuit section 34 may be provided at a left side area thereof.

As illustrated in FIG. 2, the semiconductor substrate 32 is, e.g., an Si substrate or a compound semiconductor substrate and has a cavity 35 (through hole) vertically penetrating a substantially center portion thereof. The cavity 35 serves as a back chamber or a front chamber of the microphone. The cavity 35 may be closed at its bottom. Although the cavity 35 has a rectangular parallelepiped shape with a uniform horizontal cross-section in FIG. 2, a wall surface of the cavity 35 may be tapered.

As illustrated in FIG. 2, in the sensor section 33, a diaphragm 37 (movable electrode) is provided on the upper surface of the semiconductor substrate 32 through an anchor 36, and a back plate 38 is provided above the diaphragm 37 through a minute air gap.

The diaphragm 37 is formed of a polysilicon thin film having conductivity. Although the diaphragm 37 has a disk-like shape in FIG. 3, it may be formed into a rectangular shape or any other shape. A band-like extraction wiring 39 extends outward from the diaphragm 37. The diaphragm 37 is disposed on the upper surface of the semiconductor substrate 32 so as to cover the upper face of the cavity 35, with a lower surface of an outer peripheral portion thereof supported by the anchors 36 disposed at appropriate intervals. Thus, the diaphragm 37 is separated from the upper surface of the semiconductor substrate 32, and a narrow ventilation hole 40 for allowing acoustic vibration to pass therethrough is formed between the lower surface of the outer peripheral portion of the diaphragm 37 and upper surface of the semiconductor substrate 32.

The back plate 38 includes a protective film 41 (insulting protective film) of SiN and a disk-like shaped fixed electrode film 42 (fixed electrode) of polysilicon formed on a lower surface of the protective film 41. The protective film 41 is formed into a dome shape at an area above the diaphragm 37, and a dome portion 41a having the dome shape has a space between itself and diaphragm 37.

A minute air gap is formed between a lower surface (i.e., lower surface of the fixed electrode film 42) of the back plate 38 and an upper surface of the diaphragm 37. The fixed electrode film 42 and diaphragm 37 face each other and constitute a capacitor for detecting the acoustic vibration and converting it into an electrical signal. An extraction wiring 43 extends from an edge of the fixed electrode film 42.

A large number of acoustic holes 44 for allowing the acoustic vibration to pass therethrough are formed over the substantially entire area of the back plate 38 so as to penetrate the back plate 38 from the upper surface to lower surface. As illustrated in FIG. 1, the acoustic holes 44 are arranged regularly. Although the acoustic holes 44 are triangularly arranged in three directions intersecting each other at 120 degree angles in the illustrated example, they may be arranged rectangularly or concentrically.

Further, as illustrated in FIG. 2, a minute columnar stopper 53 (protrusion) protrudes from the lower surface of the back plate 38. The stopper 53 is provided for preventing the diaphragm 37 from sticking to the back plate 38. The stopper 53 integrally protrudes from the lower surface of the protective film 41, passes the fixed electrode film 42, and protrudes from the lower surface of the back plate 38. The stopper 53 is formed of SiN like the protective film 41 and thus has insulation property.

In the sensor section 33 having the above structure, when the acoustic vibration passes the acoustic holes 44 and enters the air gap between the back plate 38 and diaphragm 37, the diaphragm 37 which is a thin film is vibrated by the acoustic vibration. The vibration of the diaphragm 37 changes a gap distance between the diaphragm 37 and fixed electrode film 42, causing a change in electrostatic capacitance between the diaphragm 37 and fixed electrode film 42. Thus, in the sensor device 31, the acoustic vibration (change in sound pressure) sensed by the diaphragm 37 represents a change in the electrostatic capacitance between the diaphragm 37 and fixed electrode film 42 and is output as an electrical signal.

The circuit section 34 serves as a power supply circuit, an amplifier circuit, or an output circuit for the sensor section 33. The circuit section 34 is formed on a surface layer of the semiconductor substrate 32 around the sensor section 33. The circuit section 34 is covered with a second insulating layer formed of $SiO_2$, i.e., an insulating covering layer 45. Further, the protective film 41 covers the insulating covering layer 45. That is, an outer peripheral portion of the dome portion 41a of the protective film 41 is tightly fitted to the upper surface of the semiconductor substrate 32, thereby fixing the protective film 41 to the semiconductor substrate 32, and a first insulating layer extending outward from the dome portion 41a, i.e., a covering area 41b of the protective film 41 covers the insulating covering layer 45 and upper surface of the semiconductor substrate 32. However, an outer peripheral edge portion of the semiconductor substrate 32 is exposed from the insulating covering layer 45 and protective film 41.

The insulating covering layer 45 is manufactured using the same material and the same process as a sacrifice layer for forming the air gap between the diaphragm 37 and fixed electrode film 42 and has a thickness equal to a height of the air gap between the diaphragm 37 and fixed electrode film 42. Further, the protective film 41 is formed in a single process, so that a thickness of the covering area 41b is equal to a thickness of the dome portion 41a.

A metal protective film 46 is formed on an upper surface of the covering area 41b of the protective film 41. The dome portion 41a is exposed from the metal protective film 46. The metal protective film 46 is formed of an Au film. Alternatively, the metal protective film 46 may be formed of a metal multilayer film with the outermost surface thereof formed of the Au film. Hereinafter, the metal protective film 46 is assumed to be formed of the Au film. The extraction wiring 39 of the diaphragm 37 is connected to the metal protective film 46 and is thus electrically conducted with the metal protective film 46. A part of the Au film is separated from the metal protective film 46 to form electrode pads 47, 48, 49a, and 49b. The electrode pad 47 is connected with the extraction wiring 43 of the fixed electrode film 42 and is further connected to, as illustrated in FIG. 2, the circuit section 34 through a through hole 51. Thus, the electrode pad 47 is a terminal having the same potential as the fixed electrode film 42. The electrode pad 48 is provided on the upper surface of the insulating covering layer 45 in an opening of the protective film 41. The electrode pads 49a and 49b are provided on an upper surface of the protective film 41, an upper surface of the insulating covering layer 45, or the upper surface of the semiconductor substrate 32. The electrode pads 48, 49a, and 49b are electrically conducted, as needed, with the circuit section 34, electrode pad 47, semiconductor substrate 32, and the like. The electrode pad 50 is a terminal formed by partially removing the Au film and is electrically conducted with the metal protective film 46 and diaphragm 37. With the above structure, the metal protective film 46 and electrode pads 47, 48, 49a, 49b, 50 can be manufactured using the same material and the same process, thereby simplifying a manufacturing process of the sensor device 31. As a result, manufacturing cost of the sensor device 31 can be reduced to achieve high mass productivity.

Further, a large part of the circuit section 34 is covered with the metal protective film 46, so that the circuit section 34 can be protected from a contamination factor or disturbance from outside. More specifically, a surface of the circuit section 34 is covered with the metal protective film 46, so that light shielding property of the circuit section 34 becomes high, preventing the circuit section 34 from being affected even when the sensor device 31 receives strong light, which in turn prevents malfunction of the circuit section 34.

Further, by connecting the electrode pad 50 to the ground by a bonding wire under a condition that the metal protective film 46 is connected to the ground, electromagnetic shield effect can be imparted to the metal protective film 46. Thus, the metal protective film 46 can shields electromagnetic waves from outside, making electromagnetic immunity (EMI) satisfactory. In general, a countermeasure against the electromagnetic wave can be made with packaging (casing); however, by applying the electromagnetic wave countermeasure to the sensor device 31 itself, the packaging can be simplified, which leads to cost reduction of the sensor device 31 including the packaging. Further, static electricity from outside is shielded by the metal protective film 46, thus making electrostatic-discharge resistance (ESD resistance) satisfactory. Further, connecting the electrode pad 50 to the ground under a condition that the metal protective film 46 is connected to a grounding pad of the circuit section 34 by a through hole or the like allows the grounding pad of the circuit section 34 to be connected to the ground at the same time, eliminating the need to individually perform ground connection.

Further, covering the circuit section 34 with the metal protective film 46 allows moisture or ion to be shielded by the metal protective film 46. As a result, humidity resistance of the sensor device 31 is improved and, further, environmental resistance thereof against corrosive gas, heavy metal contamination, or the like is also enhanced. Further, impurities such as phosphorus and boron are added to the insulating covering layer 45 (sacrifice layer for air gap formation that remains without being etched) for the purpose of increasing an etching rate for hydrofluoric acid. These impurities have effect of shielding ion contamination from outside, thereby further enhancing the environmental resistance of the sensor device 31.

Further, a metal film is a ductile material, so that covering a surface of the sensor device 31 with the metal protective film 46 enhances physical strength of the sensor device 31. Covering the circuit section 34 containing a large amount of brittle materials with the ductile material (metal protective film 46), prevents occurrence of a crack in the circuit section 34 which may be caused due to physical contact and, even if a crack occurs, it is difficult to advance further.

When the metal protective film 46 or the outermost surface thereof is formed by the Au film, the environmental resistance of the sensor device 31 is made satisfactory since Au is a metal having superior corrosion resistance and having low electrical resistance, thus enhancing the electromagnetic shield effect. In a process of manufacturing an electrostatic capacitance type MEMS microphone, sacrifice layer etching using hydrofluoric acid is carried out. Au is a material resistive to the hydrofluoric acid and is therefore suitable for the microphone manufacturing process. Further, the Au film has excellent wire bondability, so that it is best suited as a material of the electrode pad.

A manufacturing process of the sensor device 31 includes producing of a plurality of sensor device 31 on a single wafer and scanning the wafer with laser light collected thereon along a dicing street to dice the wafer into a plurality of individual chips (sensor devices 31). This is because when a method of cutting the wafer using a dicing saw is applied to the sensor device 31 having the sensor section 33, cooling water or cutting scrap may enter the sensor section 33 to cause various damages. In the sensor device 31 of the first embodiment, the outer peripheral portion of the upper surface of the semiconductor substrate 32 is exposed from the insulating covering layer 45, protective film 41, and metal protective film 46 over the entire circumference. The exposed area 52 serves as the dicing street for the laser dicing, and thus the circuit section 34 is not present in the exposed area 52. The metal protective film 46, protective film 41, and the like are not present on the dicing street to expose the upper surface of the semiconductor substrate 32 as described above, so that, at the chip dividing using the laser dicing, it is possible to prevent the laser light from being reflected by the metal protective film 46 and prevent a deviation of a focal position of the laser light or attenuation of laser light intensity by the protective film 41 and the like, thereby allowing the laser light to be collected inside the wafer with high power density. Thus, the chip dividing can be conducted reliably in short laser irradiation time, whereby it is possible to increase a dicing speed to improve throughput at the time of acoustic sensor manufacturing while reducing dividing failure rate of the sensor device 31.

A width S of the exposed area 52, according to one or more embodiments of the present invention, is 40 µm or more within such a range that a chip size is not increased more than necessary. This results from laser irradiation property. In general, according to one or more embodiments of the present invention, the dicing street has a width obtained by multiplying the wafer thickness by 0.4. For example, assuming that the wafer thickness is 400 µm, according to one or more embodiments of the present invention, the width S of the exposed area 52 is 80 µm (width of the dicing street on the wafer is 160 µm). Further, in terms of handling easiness, according to one or more embodiments of the present invention, the wafer thickness is 200 µm or more in the manufacturing of the wafer, so that the width S of the exposed area 52 is 40 µm (width of the dicing street on the wafer is 80 µm). As a result, according to one or more embodiments of the present invention, the width S of the exposed area 52 is 40 µm or more.

Second Embodiment

Figure 4:
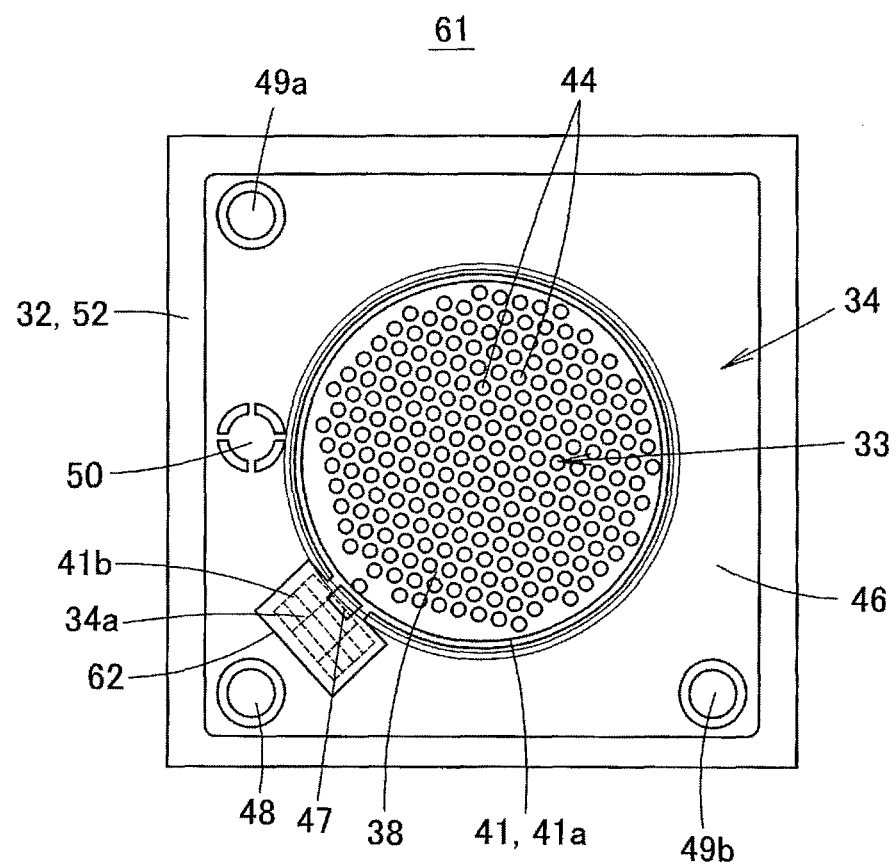
FIG. 4 is a plan view of a sensor device according to a second embodiment.
Figure 5:
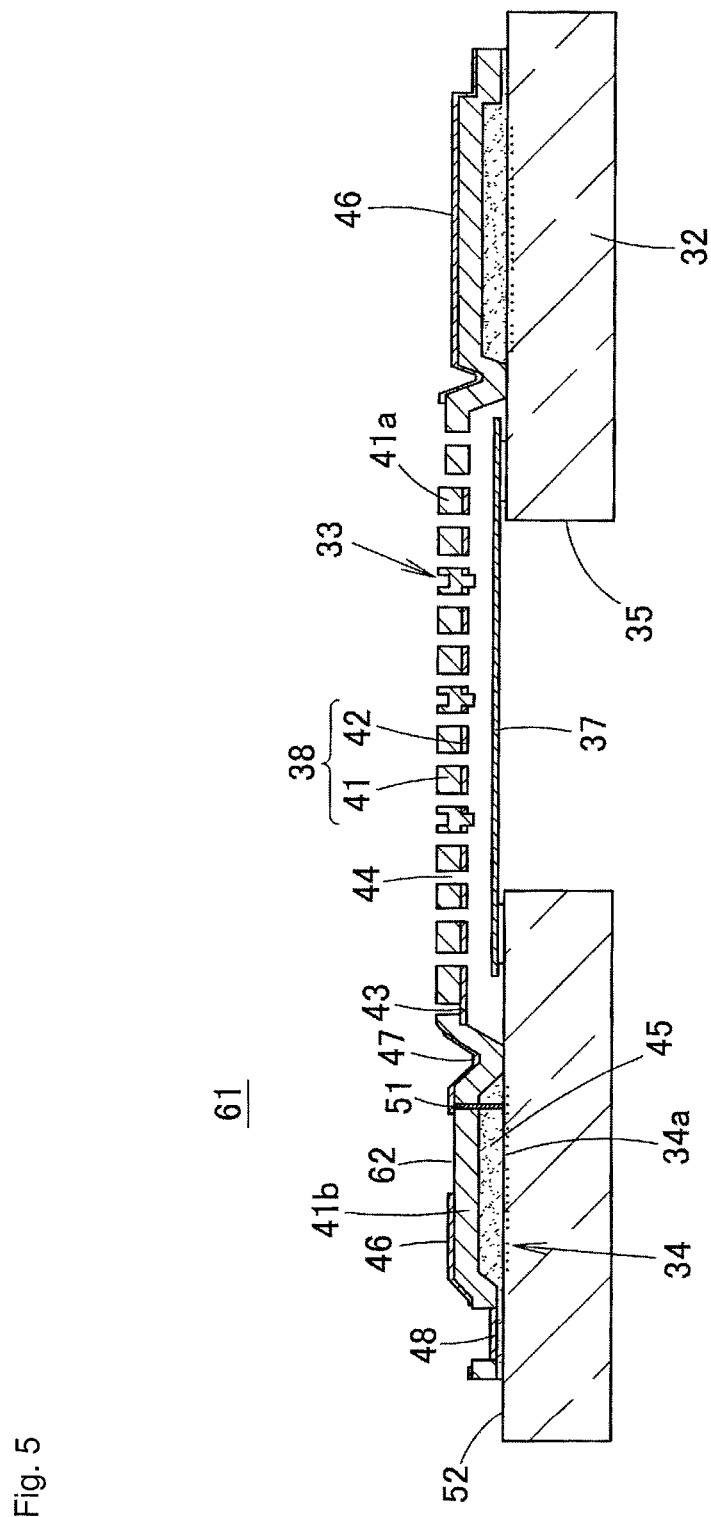
FIG. 5 is a cross-sectional view of the sensor device according to the second embodiment of the present invention.

FIGS. 4 and 5 are respectively a plan view and a cross-sectional view of a sensor device 61 according to a second embodiment of the present invention. In the second embodiment, the metal protective film 46 is partially removed at a specific portion in an area above the circuit section 34. In the area where the metal protective film 46 is removed, the circuit section 34 is covered with only the insulating covering layer 45 and protective film 41.

When the area above the circuit section 34 is covered with the metal protective film 46, an electrical parasitic component such as a parasitic capacitance is generated between the circuit section 34 and metal protective film 46, which may deteriorate characteristics of the sensor device. Therefore, in the above-described sensor device 31 of the first embodiment, the thick insulating covering layer 45 and protective film 41 (insulating material for back plate, having a thickness of 1 μm or more) are interposed between the circuit section 34 and metal protective film 46 to increase a distance between the circuit section 34 and metal protective film 46, thereby reducing the electrical parasitic component such as a parasitic capacitance caused due to presence of the metal protective film 46 and thus reducing deterioration in the characteristics of the acoustic sensor.

However, in some cases, it may be insufficient to provide only the insulating covering layer 45 and protective film 41 depending on a type of a circuit provided in the circuit section 34. For example, a circuit on an upstream side of an amplifier circuit for converting a signal of the sensor section 33 is subject to influence of the electrical parasitic component. In such a case, it is effective to partially remove the metal protective film 46 in an area above a circuit portion 34a of the circuit section 34 that is subject to the electrical parasitic component, as illustrated in FIGS. 4 and 5. Thus, at a removal portion 62 of the metal protective film 46, the covering area 41b of the protective film 41 that covers the circuit portion 34a that is subject to the electrical parasitic component is exposed.

Third Embodiment

Figure 6:
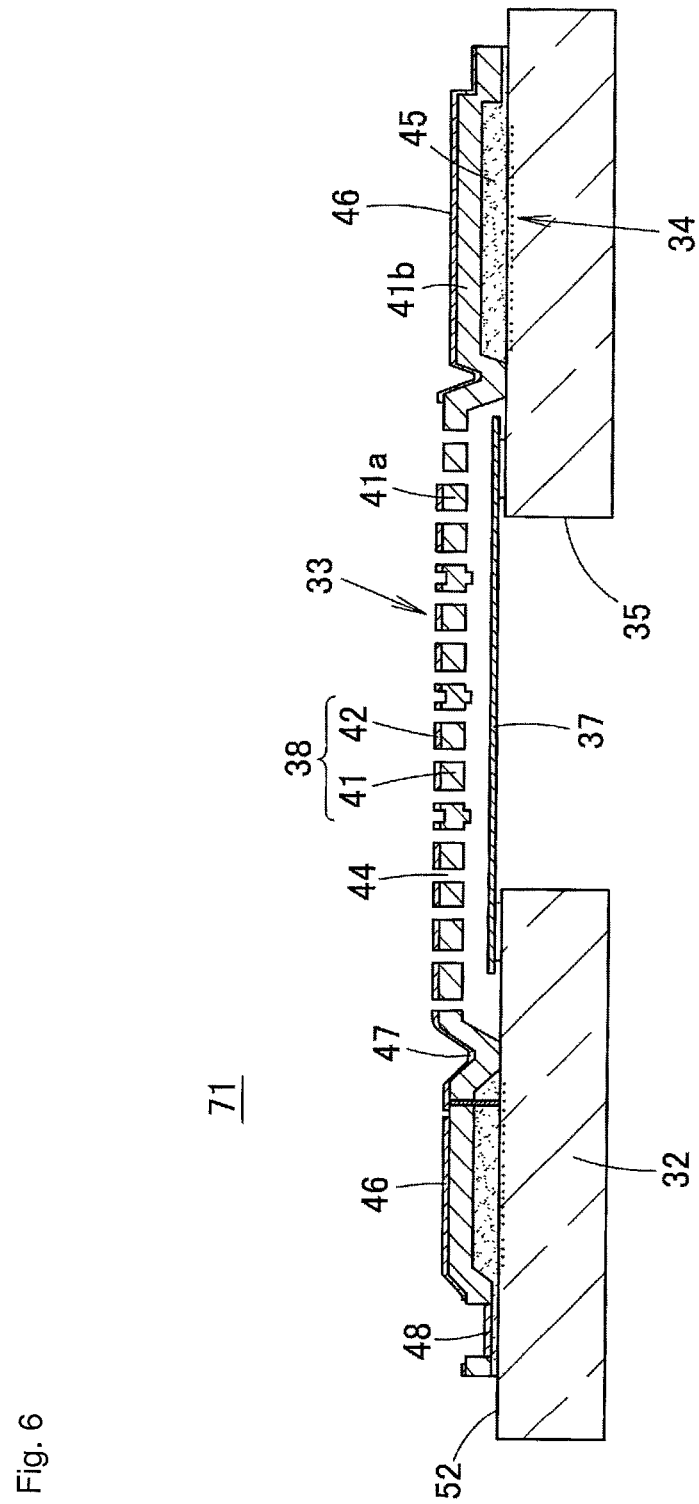
FIG. 6 is a cross-sectional view of the sensor device according to a third embodiment of the present invention.

FIG. 6 is a cross-sectional view of a sensor device according to a third embodiment of the present invention. In a sensor device 71 of the third embodiment, the fixed electrode film 42 is formed using the Au film on the upper surface of the dome portion 41a of the protective film 41. According to the third embodiment, use of Au allows both the fixed electrode film 42 and metal protective film 46 to be formed in the same process, so that the number of manufacturing steps of the sensor device 71 can be reduced to reduce manufacturing cost.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS 31, 61, 71 Sensor device
32 Semiconductor substrate
33 Sensor section
34 Circuit section
35 Cavity
37 Diaphragm
38 Back plate
41 Protective film
41a Dome portion
41b Covering area
42 Fixed electrode film
45 Insulating covering layer
46 Metal protective film
47, 48, 49a, 49b, 50 Electrode pad
51 Through hole
52 Exposed area
62 Removal area

The invention claimed is:

1. A sensor device comprising:
a substrate;
a sensor section provided on an upper surface of the substrate;
a circuit section provided on the upper surface of the substrate;
a plurality of connection pads that electrically conduct with the sensor section or the circuit section; and
a metal protective film substantially covering the entire circuit section from above,
wherein the sensor section includes:
a movable electrode provided above the substrate;
a dome portion formed of an insulating material fixed to the upper surface of the substrate so as to cover the movable electrode with a gap interposed between itself and movable electrode; and
a fixed electrode provided in the dome portion at a position facing the movable electrode,
wherein a surface of the circuit section is covered with a second insulating layer having a thickness equal to that of a gap formed between the movable electrode and fixed electrode, and
wherein the metal protective film is formed above the second insulating layer.

2. The sensor device according to claim 1,
wherein the circuit section is covered with a first insulating layer, and
wherein the metal protective film is formed on an upper surface of the first insulating film.

3. A sensor device comprising:
a substrate;
a sensor section provided on an upper surface of the substrate;
a circuit section provided on the upper surface of the substrate;
a plurality of connection pads that electrically conduct with the sensor section or the circuit section; and
a metal protective film substantially covering the entire circuit section from above,
wherein the circuit section is covered with a first insulating layer,
wherein the metal protective film is formed on an upper surface of the first insulating layer,
wherein the sensor section includes:
a movable electrode provided above the substrate;
a dome portion formed of an insulating material fixed to the upper surface of the substrate so as to cover the movable electrode with a gap interposed between itself and movable electrode; and
a fixed electrode provided in the dome portion at a position facing the movable electrode, and
wherein the first insulating layer has a thickness equal to that of the dome portion and is formed of the same material as that of the dome portion.

4. The sensor device according to claim 3,
wherein the metal protective film is removed partially in an area above the circuit section.

5. The sensor device according to claim 3,
wherein the metal protective film is electrically short-circuited to some of the connection pads.

6. The sensor device according to claim 3,
wherein an outer peripheral portion of the upper surface of the substrate is exposed from the metal protective film.

7. The sensor device according to claim 3,
wherein an area having a length of at least 40 mm or more from an outer peripheral edge of the upper surface of the substrate is exposed from the metal protective film.

8. The sensor device according to claim 3,
wherein at least a surface of the metal protective film is formed of an Au film.

9. A sensor device comprising:
a substrate;
a sensor section provided on an upper surface of the substrate;
a circuit section provided on the upper surface of the substrate;
a plurality of connection pads that electrically conduct with the sensor section or the circuit section; and
a metal protective film substantially covering the entire circuit section from above,
wherein the circuit section is covered with a first insulating layer,
wherein the metal protective film is formed on an upper surface of the first insulating layer,
wherein the sensor section includes:
  a movable electrode provided above the substrate;
  a dome portion formed of an insulating material fixed to the upper surface of the substrate so as to cover the movable electrode with a gap interposed between itself and movable electrode; and
  a fixed electrode provided in the dome portion at a position facing the movable electrode,
wherein a surface of the circuit section is covered with a second insulating layer having a thickness equal to that of a gap formed between the movable electrode and fixed electrode, and
wherein the metal protective film is formed above the second insulating layer.

10. A sensor device comprising:
a substrate;
a sensor section provided on an upper surface of the substrate;
a circuit section provided on the upper surface of the substrate;
a plurality of connection pads that electrically conduct with the sensor section or the circuit section; and
a metal protective film substantially covering the entire circuit section from above,
wherein the sensor section includes:
  a movable electrode provided above the substrate;
  a dome portion formed of an insulating material fixed to the upper surface of the substrate so as to cover the movable electrode with a gap interposed between itself and movable electrode; and
  a fixed electrode provided in the dome portion at a position facing the movable electrode,
wherein the circuit section is covered with a first insulating layer having a thickness equal to that of the dome portion, and
wherein the metal protective film is formed on an upper surface of the first insulating layer.

* * * * *